United States Patent
Kim et al.

(10) Patent No.: US 12,273,477 B2
(45) Date of Patent: Apr. 8, 2025

(54) DISPLAY MODULE BENDING APPARATUS AND DISPLAY MODULE BENDING METHOD USING THE SAME

(71) Applicant: Samsung Display Co., Ltd., Yongin-si (KR)

(72) Inventors: Dongwoo Kim, Seoul (KR); Jong-Hoon Park, Asan-si (KR); Boyoung Kim, Hwaseong-si (KR); Myunggil Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 17/734,387

(22) Filed: May 2, 2022

(65) Prior Publication Data

US 2023/0041389 A1 Feb. 9, 2023

(30) Foreign Application Priority Data

Aug. 3, 2021 (KR) .................. 10-2021-0101690

(51) Int. Cl.
  *H04M 1/02* (2006.01)
  *H05K 5/02* (2006.01)
(52) U.S. Cl.
  CPC ........ *H04M 1/0268* (2013.01); *H05K 5/0217* (2013.01)
(58) Field of Classification Search
  CPC .................. G01B 11/02; H04M 1/026; H04M 1/0266–0269; H05K 1/0269; H05K 3/0014; H05K 5/0217
  See application file for complete search history.

(56) References Cited

U.S. PATENT DOCUMENTS

| | | | |
|---|---|---|---|
| 10,165,715 B2 | 12/2018 | Choi et al. | |
| 10,919,211 B2 | 2/2021 | Choi et al. | |
| 10,945,340 B2 | 3/2021 | Lee et al. | |
| 2006/0107566 A1* | 5/2006 | Van Rens | G06F 1/1652 |
| | | | 40/515 |

FOREIGN PATENT DOCUMENTS

| | | |
|---|---|---|
| KR | 1020150114407 A | 10/2015 |
| KR | 1020170104102 A | 9/2017 |
| KR | 1020180011443 A | 2/2018 |
| KR | 1020180027665 A | 3/2018 |
| KR | 102052901 B1 | 12/2019 |
| KR | 102135789 B1 | 7/2020 |
| KR | 102160685 B1 | 9/2020 |

OTHER PUBLICATIONS

Merriam-Webster meaning of "compensating", printed on Dec. 9, 2024. Retrieved from Internet: <https://www.merriam-webster.com/dictionary/compensating>. (Year: 2024).*

* cited by examiner

*Primary Examiner* — Ronald Eisner
(74) *Attorney, Agent, or Firm* — CANTOR COLBURN LLP

(57) ABSTRACT

A display module bending apparatus includes: a stage on which a display module including a display panel and a circuit board is seated; a bending arm which fixes the circuit board and bending the circuit board based on a first reference; a first measuring unit which measures first information; a second measuring unit disposed on the stage and which measures second information; and a control unit which compensates the first reference based on the first information and the second information.

13 Claims, 9 Drawing Sheets

DISPLAY MODULE BENDING APPARATUS AND DISPLAY MODULE BENDING METHOD USING THE SAME

This U.S. application claims priority to Korean Patent Application No. 10-2021-0101690, filed on Aug. 3, 2021, and all the benefits accruing therefrom under 35 U.S.C. § 119, the content of which in its entirety is herein incorporated by reference.

BACKGROUND

The present disclosure relates to a display module bending apparatus for reducing a stress applied to a bending area and a display module bending method using the same.

An importance of a display device has grown together with development of multimedia. Accordingly, various kinds of display devices such as a liquid crystal display ("LCD") and an organic light emitting display ("OLED") have been used.

In the display device, a flexible circuit board has been used to transmit signals or electric power. A bending process may be performed on the flexible circuit board based on a structure or a characteristic of the display device. Here, the flexible circuit board may be damaged or may not properly function by a stress applied thereto

SUMMARY

The present disclosure provides a display module bending apparatus for reducing a stress applied to a bending area and a display module bending method using the same.

An embodiment of the present invention provides a display module bending apparatus including: a stage on which a display module including a display panel and a circuit board is seated; a bending arm which fixes the circuit board and bend the circuit board based on a first reference; a first measuring unit which measures first information; a second measuring unit disposed on the stage and which measures second information; and a control unit which compensates the first reference based on the first information and the second information.

In an embodiment, the control unit may calculate a bending path of the circuit board based on the first information.

In an embodiment, the bending path may be calculated based on a movement path of the bending arm.

In an embodiment, the control unit may include a simulation part, the first information may include a plurality of measurement points, and the simulation part may calculate the movement path based on the plurality of measurement points.

In an embodiment, the control unit may include a compensation part which calculates a second reference by compensating the first reference.

In an embodiment, the bending arm may bend the circuit board based on the second reference.

In an embodiment, the first reference may include first reference information and second reference information, and the control unit may include the bending path with the first reference information. Here, the control unit may compensate the first reference based on the bending path when the first information is not matched with the first reference information.

In an embodiment, the second reference may include third reference information different from the first reference information, and the control unit may compare the bending path with the third reference information.

In an embodiment, the first measuring unit may be disposed to face a side surface of the display panel.

In an embodiment, the first measuring unit may include an image photographing part which photographs an image.

In an embodiment, the first measuring unit may include a laser module disposed on the stage and which irradiates a laser.

In an embodiment, the display panel may include a first mark, the circuit board may include a second mark, and the second information may include a distance between the first mark and the second mark.

In an embodiment, the control unit may compare the distance with the second reference information, and the control unit may compensate the first reference based on the distance when the distance is not matched with the second reference information.

In an embodiment of the present invention, a display module bending method includes: providing a display module on a stage; fixing the display module by a bending arm; bending the display module based on a first reference; measuring first information by a first measuring unit; determining whether the first information satisfies the first reference; measuring second information by a second measuring unit; determining whether the second information satisfies the first reference; and compensating the first reference.

In an embodiment, the determining of whether the first information satisfies the first reference may include: calculating a movement path of the bending arm based on the first information; and comparing the movement path with the first reference.

In an embodiment, the compensating of the first reference may include: compensating the first reference based on the movement path when the movement path is not matched with the first reference.

In an embodiment, the display module may include a first mark and a second mark disposed at a different position from the first mark, and the determining of whether the second information satisfies the first reference may include: measuring a distance between the first mark and the second mark based on the second information; and comparing the distance with the first reference.

In an embodiment, the compensating of the first reference may include compensating the first reference based on the distance when the distance is not matched with the first reference.

In an embodiment, the compensating of the first reference may include calculating a second reference based on the first information and the second information.

In an embodiment, the display module bending method may further include bending the display module based on the second reference.

BRIEF DESCRIPTION OF THE FIGURES

The accompanying drawings are included to provide a further understanding of the present invention, and are incorporated in and constitute a part of this specification. The drawings illustrate embodiments of the present invention and, together with the description, serve to explain principles of the present invention. In the drawings.

DETAILED DESCRIPTION

Figure 1:
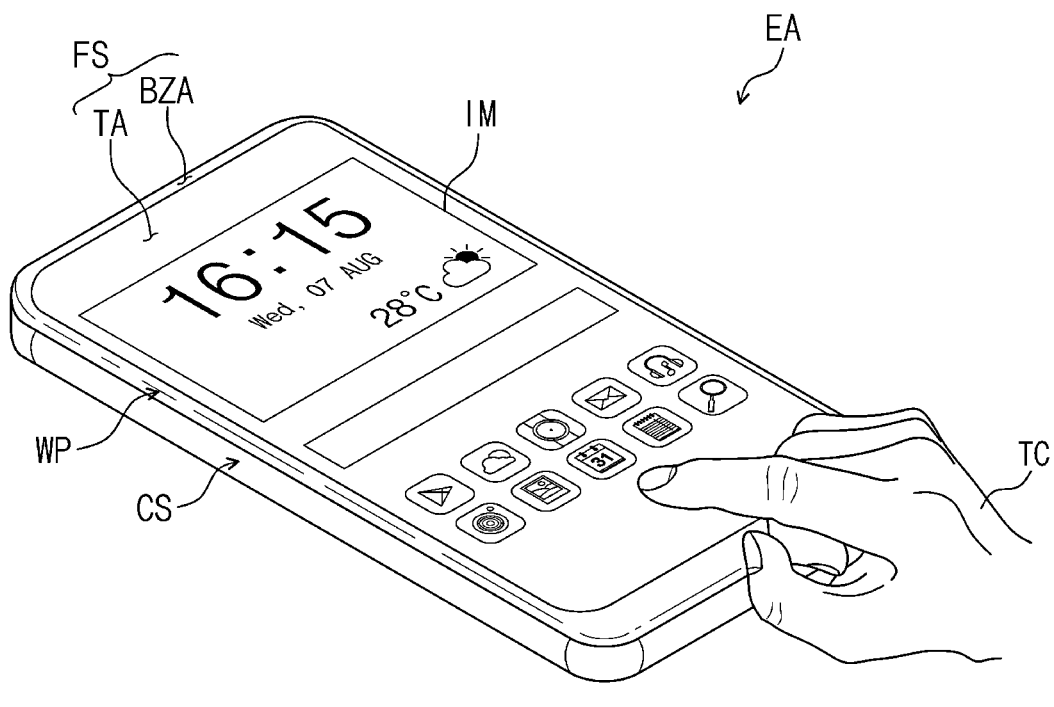
FIG. 1 is a perspective view illustrating a display device according to another embodiment of the present invention.

In this specification, it will be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. As used herein, the term and/or includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the present invention will be described with reference to the accompanying drawings.

Figure 2:
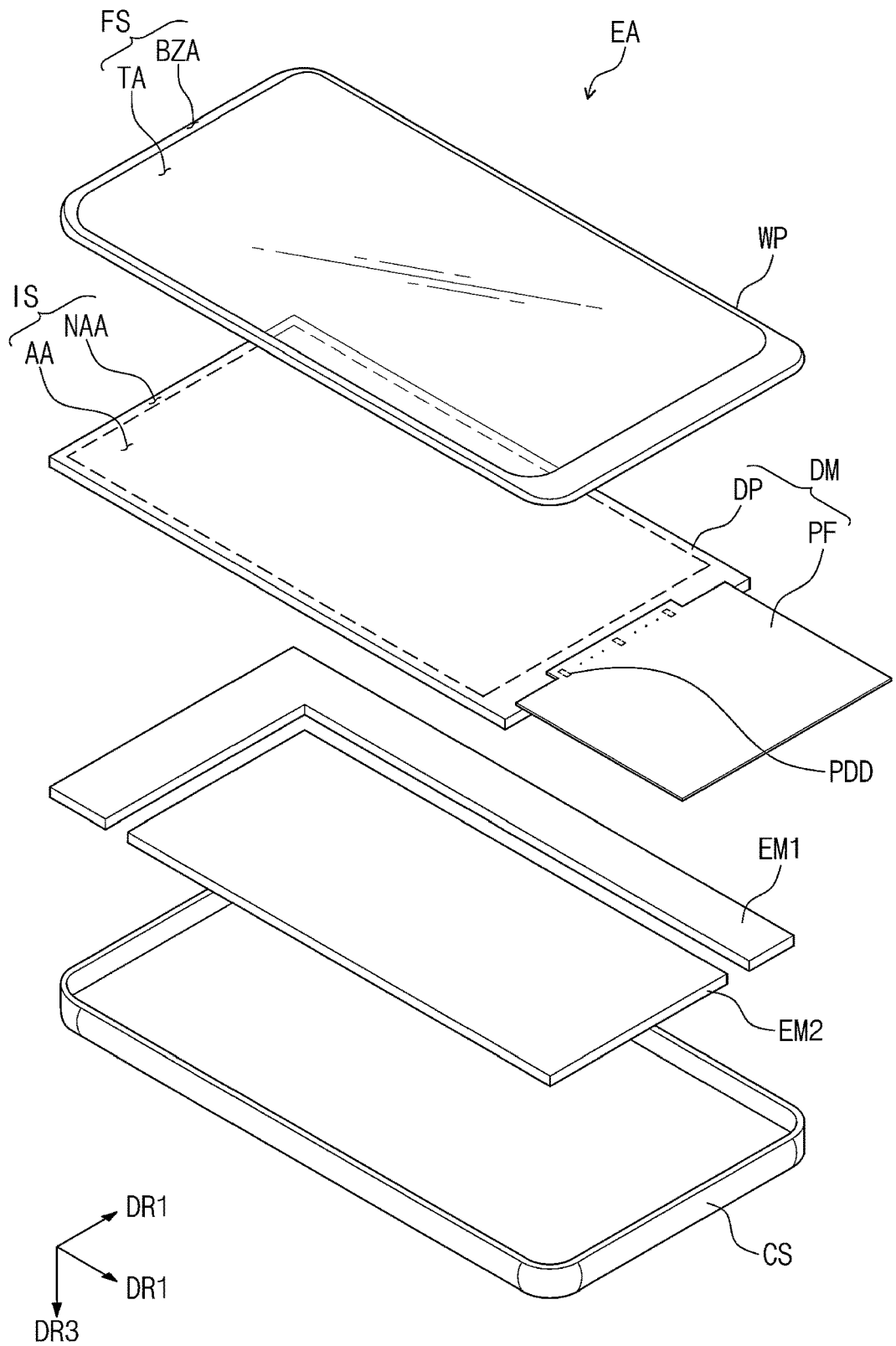
FIG. 2 is an exploded perspective view illustrating the display device according to an embodiment of the present invention.

FIG. 1 is a perspective view illustrating a display device according to an embodiment of the present invention, and FIG. 2 is an exploded perspective view illustrating the display device according to an embodiment of the present invention.

Referring to FIGS. 1 and 2, a display device EA may be activated by an electrical signal. The display device EA may include various embodiments. For example, the display device EA may include tablet computers, notebook computers, personal computers, and smart televisions. In this embodiment, a smartphone is illustrated as an example of the display apparatus EA.

The display device EA may display an image IM on a front surface FS. The front surface FS may be parallel to a surface defined by a first direction DR1 and a second direction DR2. The front surface FS may include a transmission area TA and a bezel area BZA adjacent to the transmission area TA.

The display device EA may display the image IM on the transmission area TA. The image IM may include at least one of a static image or a dynamic image. In FIG. 1, a clock window and icons are illustrated as an example of the image IM.

The transmission area TA may have a rectangular shape parallel to each of the first direction DR1 and the second direction DR2. However, this is merely an example, and the embodiment of the present invention is not limited to the rectangular shape of the transmission area TA. For example, the transmission area TA according to an embodiment of the present invention may have various shapes in another embodiment.

The bezel area BZA may have a predetermined color. The bezel area BZA may have a relatively lower light transmittance than that of the transmission area TA. The bezel area BZA may be adjacent to the transmission area TA. The bezel area BZA may define a shape of the transmission area TA. The bezel area BZA may surround the transmission area TA. However, this is merely an example, and the bezel area BZA according to an embodiment of the present invention may be disposed adjacent to only one side of the transmission area TA or omitted. The display device EA according to an embodiment of the present invention may include various embodiments and is not limited to any one embodiment.

A normal direction of the front surface FS may correspond to a direction opposite to a thickness direction DR3 (hereinafter, referred to as a third direction). In this embodiment, a front surface (or top surface) and a rear surface (or bottom surface) of each of members are defined based on a direction in which the image IM is displayed. The front surface and the rear surface may be opposite to each other in the third direction DR3.

Here, directions indicated by the first to third directions DR1, DR2 and DR3, as relative concepts, may be converted with respect to each other.

The display device EA according to an embodiment of the present invention may sense an external input TC applied from the outside. The external input TC may include various types of external inputs such as a portion of a user's body, light, heat, or pressure. Also, the display device EA may sense an input approaching or being adjacent as well as an input contacting the display device EA.

The display device EA may include a window WP, a display module DM, a control module EM1, a power supply unit EM2, and an external case CS. The window WP and the external case CS according to an embodiment of the present invention may be coupled to provide an appearance of the display device EA.

The window WP may be disposed on the display module DM to cover a front surface IS of the display module DM. The window WM may include an optically clear insulating material. For example, the window WP may include a glass substrate, a sapphire substrate, or a plastic film. The window WP may have a multilayer or single-layer structure. For example, the window WP may have a laminated structure of a plurality of plastic films coupled by an adhesive agent or a laminated structure in which a glass substrate and a plastic film are coupled by an adhesive agent.

The window WP may have a front surface FS exposed to the outside. The front surface FS of the display device EA may be defined by the front surface FS of the window WP.

The display module DM may be disposed below the window WP. The display module DM may display the image IM and sense the external input TC. The display module DM may include a front surface IS including a display area AA and a non-display area NAA. The display area AA may be activated by an electric signal.

The active area AA according to an embodiment of the present invention may be an area on which the image IM is displayed and by which the external input TC is sensed at the same time. The transmission area TA may overlap the display area AA. For example, the transmission area TA overlaps an entire surface or at least a portion of the active area AA. Thus, a user may view the image IM through the transmission area TA or provide the external input TC. However, this is merely an example. In the display area AA according to an embodiment of the present invention, an area on which the image IM is displayed and an area by which the external input TC is sensed may be separated from each other. However, the embodiment of the present invention is not limited thereto.

The non-display area NAA may be covered by the bezel area BZA. The non-display area NAA may be adjacent to the display area AA. The non-display area NAA may surround the display area AA. A driving circuit or a driving line for driving the display area AA may be disposed in the non-display area NAA.

The display module DM according to an embodiment of the present invention may be assembled in a flat state in which the display area AA and the non-display area NAA face the window WP. However, this is merely an example, and a portion of the non-display area NAA according to an embodiment of the present invention may be bent. Here, as a portion of the non-display area NAA faces a rear surface of the display module DM, the bezel area BZA in the front surface of the display device EA may decrease. Also, the display module DM may be assembled in a state in which a portion of the display area AA is bent. However, this is merely an example, and the non-display area NAA according to an embodiment of the present invention may be omitted.

The display module DM may include a display panel DP and a circuit board PF.

The display panel DP may be a component that substantially generates the image IM. The image IM generated by the display panel DP may be displayed on the front surface IS and recognized by the user from the outside through the transmission area TA. The display panel DP according to an embodiment of the present invention may be a light emitting display panel. However, the embodiment of the present invention is not particularly limited thereto. For example, the display panel DP may be an organic light emitting display panel, a quantum dot light emitting display panel, a micro-LED display panel, or a nano-LED display panel. The organic light emitting display panel may include a light emitting layer containing an organic light emitting material. The quantum dot light emitting display panel may include a light emitting layer containing a quantum dot or a quantum rod. The micro-LED display panel may include a light emitting layer containing a micro-LED. The nano-LED display panel may include a light emitting layer containing a nano-LED.

The circuit board PF may be electrically connected to the display panel DP. The circuit board PF may be connected to display pads PDD of the display panel DP, which are disposed on the non-display area NAA. The circuit board PF may provide an electrical signal for driving the display panel DP to the display panel DP. In an embodiment of the present invention, the circuit board PF is illustrated as a flexible circuit film.

The control module EM1 may be disposed below the display module DM. The control module EM1 may provide an electrical signal to the display module DM. The control module EM1 may include various functional modules for driving the display module DM and a connector for supplying power. The functional modules may include a wireless communication module, an image input module, a sound input module, a memory, an external interface, a light emitting module, a light receiving module, and a camera module. The functional modules may be mounted to a motherboard. The motherboard may include a rigid-type printed circuit board. Some of the functional modules may be electrically connected to the motherboard through the flexible circuit film instead of being mounted to the motherboard.

The power supply unit EM2 may be disposed below the display module DM. The power supply unit EM2 may supply power that is necessary for an overall operation of the display device EA. The power supply unit EM2 may include a typical battery module.

The external case CS may be disposed below the control module EM1 and the power supply unit EM2. The external case CS may provide the appearance of the display device EA together with the window WP. The external case CS may include a material having rigidity greater than that of the display module DM.

Although the external case CS having one body is illustrated as an example in an embodiment of the present invention, the embodiment of the present invention is not limited thereto. For example, the external case CS according to an embodiment of the present invention may include a plurality of bodies that are assembled to each other. For example, the external case CS may include a plurality of frames and/or plates, which are made of glass, plastic, or metal. The external case CS may provide a predetermined accommodation space. The display module DM, the control module EM1, and the power supply unit EM2 may be accommodated in the accommodation space and protected from an external impact.

Figure 3:
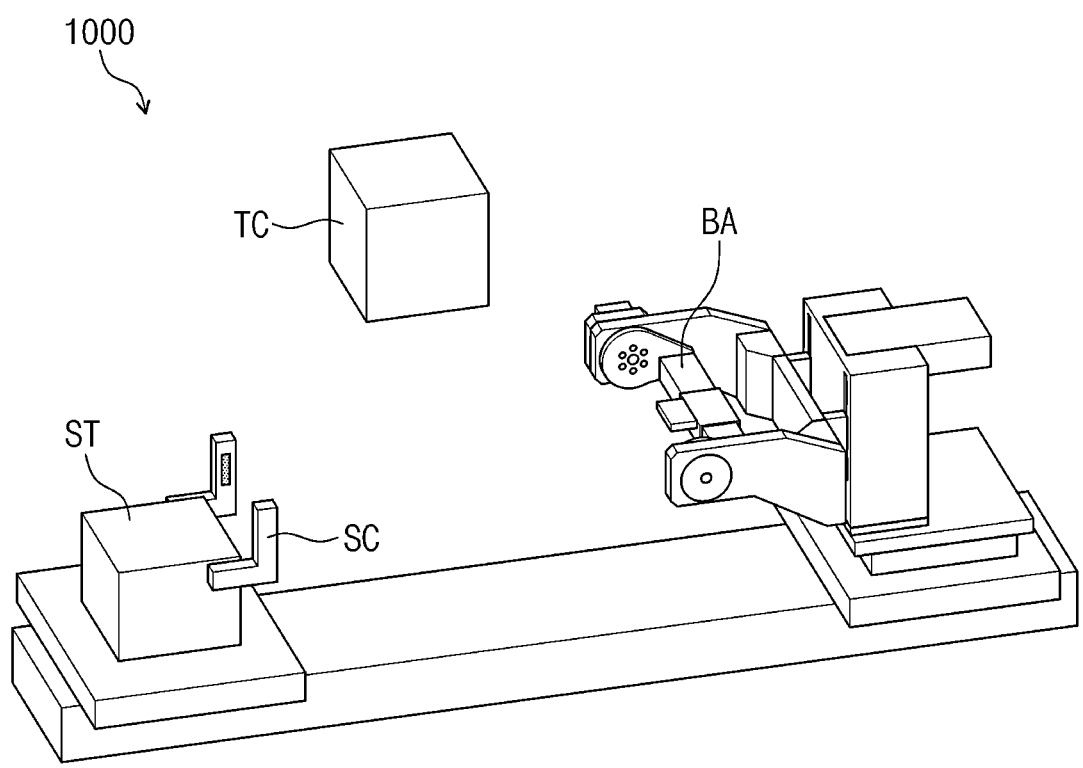
FIG. 3 is a perspective view illustrating a display module bending apparatus according to an embodiment of the present invention.
Figure 3:
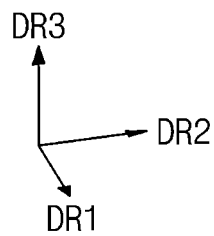

FIG. 3 is a perspective view illustrating a display module bending apparatus according to an embodiment of the present invention.

Referring to FIGS. 2 and 3, a display module bending apparatus 1000 may include a stage ST, a bending arm BA, a first measuring unit SC, and a second measuring unit TC.

The stage ST may provide a space in which an object to be processed is disposed. The object to be processed may include the display module DM. The display panel DP may be disposed on the stage ST. The display panel DP may be provided in a seat part of the stage ST and fixed thereto. However, this is merely an example, and the embodiment of the present invention is not limited to the object to be processed according to the present embodiment. For example, the object to be processed may include a film member to which an electronic element is mounted, a touch screen panel, and a flexible printed circuit board in another embodiment.

The bending arm BA may be spaced apart from the stage ST. The bending arm BA may move in each of the first direction DR1, the second direction DR2, and the third direction DR3. The bending arm BA may perform rotation movement by using one shaft extending in the first direction DR1 as a rotation shaft. That is, the bending arm BA may operate along four axes.

The bending arm BA may contact at least one surface of the circuit board PF to bend the circuit board PF. A plurality of vacuum suction holes may be defined in the bending arm BA. The bending arm BA may directly contact the circuit board PF and vacuum suction the circuit board PF.

The bending arm BA may have a bar shape extending in the first direction DR1. However, this is merely an example, and the embodiment of the present invention is not limited to the shape of the bending arm BA according to the present embodiment. For example, the bending arm BA may have a shape including at least a curved portion and extending in the first direction DR1 in another embodiment.

The first measuring unit SC may be disposed adjacent to the stage ST. The first measuring unit SC may include a first image photographing part for photographing an image. The first image photographing part may include a charge couple device ("CCD") camera or a complementary metal-oxide semiconductor ("CMOS") camera. The first measuring unit SC may measure first information. For example, the first information may include a plurality of measuring points CP (refer to FIG. 6). This will be described later.

The second measuring unit TC may be disposed on the stage ST. The second measuring unit TC may include a second image photographing part for photographing an image. The second image photographing part may include a CCD camera or a CMOS camera. The second measuring unit SC may measure second information. For example, the second information may include information on alignment between the display panel DP and the circuit board PF. This will be described later.

Figure 4:
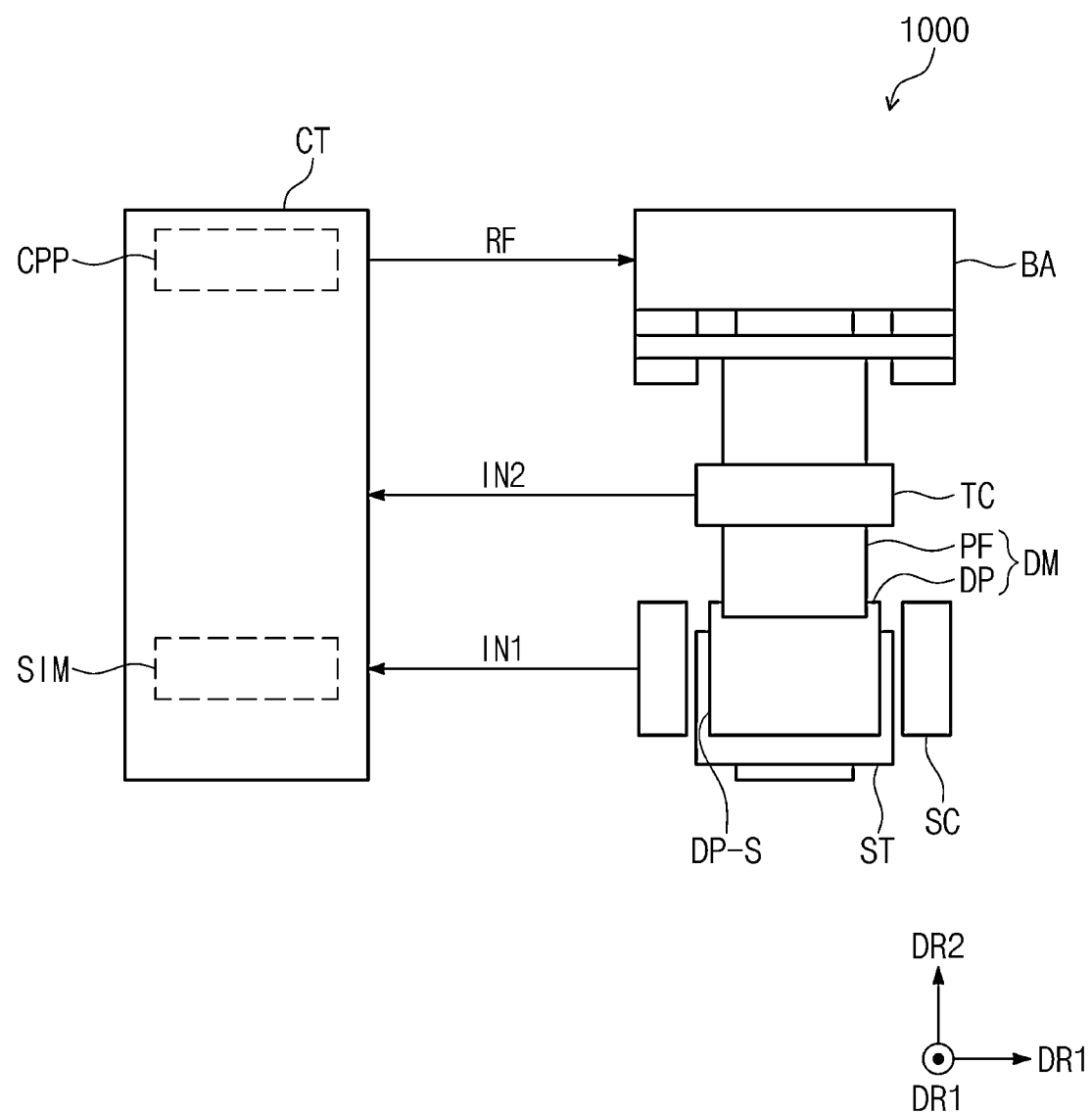
FIG. 4 is a block diagram illustrating the display module bending apparatus according to an embodiment of the present invention.
Figure 5:
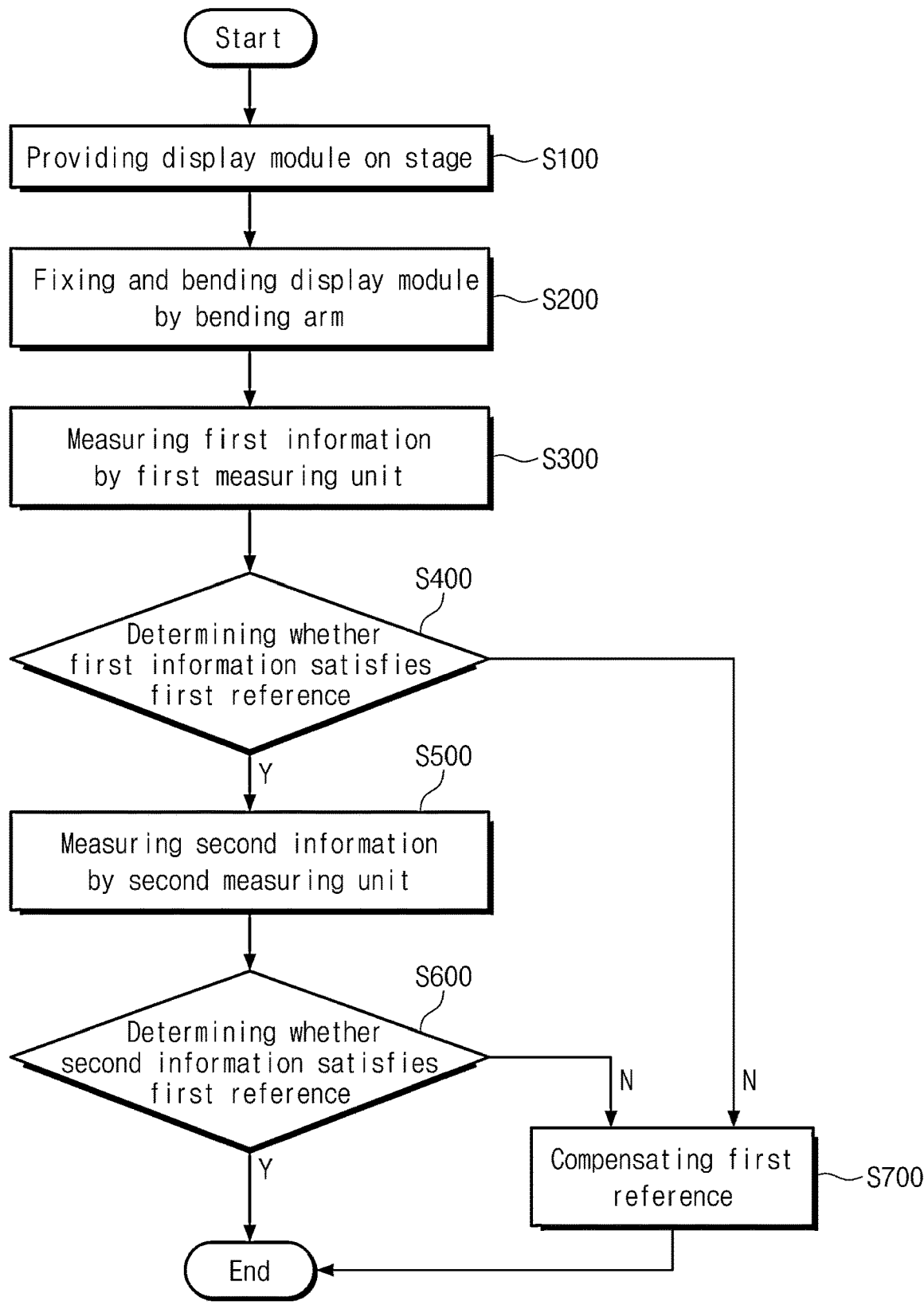
FIG. 5 is a flowchart representing a display module bending method according to an embodiment of the present invention.

FIG. 4 is a block diagram illustrating the display module bending apparatus according to an embodiment of the present invention, and FIG. 5 is a flowchart illustrating a display module bending method according to an embodiment of the present invention.

Referring to FIGS. 4 and 5, the display module bending apparatus 1000 (refer to FIG. 3) may further include a control unit CT.

A display module DM may be provided on a stage ST in a process S100. A display panel DP of the display module DM may be seated on the stage ST.

A bending arm BA may fix the display module DM in a process S200. A circuit board PF of the display module DM may be fixed to the bending arm BA.

The bending arm BA may bend the circuit board PF based on a first reference RF in a process S200. For example, the bending arm BA may bend the circuit board PF by about 180° to face the display panel DP.

A first measuring unit SC may be disposed to face a side surface DP-S of the display panel DP. The first measuring unit SC may measure first information IN1 in a process S300. For example, the first measuring unit SC may photograph the side surface DP-S of the display panel DP to obtain the first information IN1. A control unit CT may receive the first information IN1 from the first measuring unit SC. The process S300 of measuring the first information IN1 by the first measuring unit SC may be performed at the same time with the process S200 of bending the circuit board PF.

The control unit CT may determine whether the first information IN1 satisfies the first reference RF in a process S400. The control unit CT may include a simulation part SIM and a compensation part CPP. The simulation part SIM may calculate a bending path RP (refer to FIG. 6) of the circuit board PF based on the first information IN1.

The first reference RF may include first reference information and second reference information. The control unit CT may compensate the first reference RF based on the bending path RP (refer to FIG. 6) when the first information IN1 is not matched with the first reference information of the first reference RF in a process S700. The compensation part CPP may calculate a second reference by compensating the first reference RF. This will be described later. Thereafter, the bending process of the display module DM may be finished, and then a bending process of the next display module DM may be performed.

A second measuring unit TC may be disposed on the display panel DP and the circuit board PF. The second measuring unit TC may measure second information IN2 when the first information IN1 is matched with the first reference information in a process S500. For example, the second measuring unit TC may photograph a top surface of each of the display panel DP and the circuit board PF to generate the second information IN2. The control unit CT may receive the second information IN2 from the second measuring unit TC. Here, a feature in which the first information IN1 is matched with the first reference information may represent that the first information IN1 satisfies the first reference RF.

The control unit CT may determine whether the second information IN2 satisfies the first reference RF. The control unit CT may calculate distances d1 and d2 (refer to FIG. 7) between a first mark AM1 (refer to FIG. 7) of the display panel DP and a second mark AM2 (refer to FIG. 7) of the circuit board PF based on the second information IN2.

The control unit CT may compensate the first reference RF based on the distances d1 and d2 (refer to FIG. 7) when the second information IN2 is not matched with the second reference information of the first reference RF. The compensation part CPP may calculate a second reference by compensating the first reference RF. This will be described later. Thereafter, the bending process of the display module DM is finished, and then a bending process of the next display module DM may be performed.

When the second information IN2 is matched with the second reference information, the control unit CT may finish the bending process of the display module DM and perform a bending process of the next display module DM. Here, a feature in which the second information IN2 is matched with the second reference information may represent that the second information IN2 satisfies the first reference RF.

According to an embodiment of the present invention, one bending process may be performed on one display module DM based on the first reference RF. The compensation part CPP may calculate the second reference by compensating the first reference RF. In the bending process of the next display module DM, one bending process may be performed based on the second reference. That is, only one bending process may be performed on each of the plurality of display modules DM instead of performing the bending process on one display module DM several times for the optimized bending process of the display module DM, and as the bending processes are performed, an optimized bending value may be provided. Thus, the display module bending apparatus preventing a tact time loss and the display module bending method using the same may be provided.

However, this is merely an example, and the embodiment of the present invention is not limited to this display module DM bending method. In another embodiment, for example, the display module DM bending method may perform the process S500 of measuring the second information IN2 by the second measuring unit TC and simultaneously perform the process S700 of compensating the first reference RF, although the first information IN1 is not satisfied with the first reference RF.

According to an embodiment of the present invention, the second reference may be calculated as the first reference RF is compensated in the previously performed bending process of the display module DM. In the following bending process of the display module DM, the bending arm BA may bend the circuit board PF based on the second reference compensated in the previous bending process. As the bending processes of the display module DM are performed, the optimized bending value may be provided to the display module DM to be bent in a following process. A stress applied to the display module DM when bent may be minimized. A damage applied to the display module DM may be minimized. A quality of the display module DM may improve. A process efficiency may improve by reducing a damage caused by bending. Thus, the display module bending apparatus 1000 capable of minimizing a damage applied to the display module DM during the bending process and the display module bending method may be provided.

Figure 6:
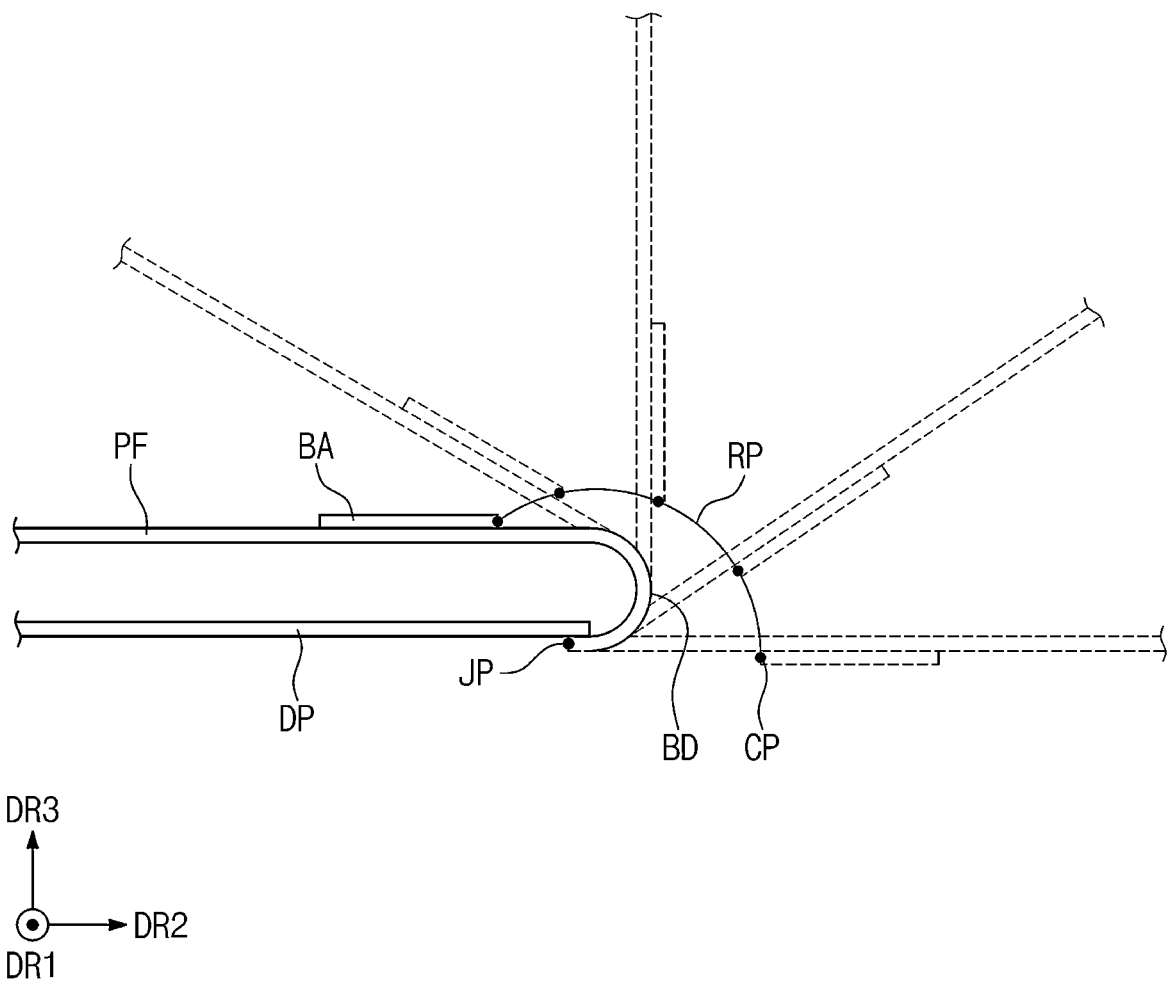
FIG. 6 is a view illustrating a process of measuring first information by a first measuring unit and a process of determining whether the first information satisfies a first reference according to an embodiment of the present invention.

FIG. 6 illustrates a process of measuring the first information by the first measuring unit and a process of determining whether the first information satisfies the first reference according to an embodiment of the present invention.

Referring to FIGS. 4 to 6, the first measuring unit SC may be disposed at a side surface DP-S of the display module DM. The first information IN1 may include a plurality of measurement points CP obtained by measuring positions of the bending arm BA with a predetermined time interval. For example, the first measuring unit SC may include a camera having an operating speed of about 100 frames per second (fps). Although four measurement points CP are illustrated as an example in FIG. 6, the embodiment of the present invention is not limited to the number of the plurality of measurement points CP shown in FIG. 6.

The simulation part SIM may calculate a movement path of the bending arm BA based on the plurality of measurement points CP and a reference point JP. The control unit CT may calculate the bending path RP based on the movement path. The reference point JP may be referred to as a center point of a curvature defined by the bending path RP. The reference point JP may be defined as one end of the circuit board PF.

The bending path RP may include a first measurement point measured at a start point of the bending arm BA, a second measurement point measured at an arrival point after bent, and a curve continuously connected between the first measurement point and the second measurement point.

The bending arm BA may contact one surface of the circuit board PF to push up or pull the circuit board PF, thereby bending the circuit board PF. A bending area BD may be defined as a part of the circuit board PF, that is bent. The bending arm BA may face the stage ST in a state in which the bending is completed. For example, the bending arm BA may bend so that the circuit board PF is disposed on a rear surface of the display panel DP.

In the process S700 of compensating the first reference RF, the control unit CT may use an algorithm. The algorithm may include artificial intelligence ("AI") imitating a way of thinking of humans. The artificial intelligence (AI) may include the algorithm such as machine learning or deep learning. For example, the algorithm may be a design of experiment ("DOE"). The design of experiment (DOE) may refer to a method of selecting an important cause at a low cost among many causes that bring abnormal fluctuations based on a statistical analysis method and quantitatively measuring an effect thereof. The design of experiment (DOE) may derive an optimized bending value through an optimization process such as a regression analysis and a least squares method using a preset experimental value. As used in connection with various embodiments of the disclosure, the term "module/unit" may include a unit implemented in hardware, software, or firmware, and may be interchangeably used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC), and the control unit CT may be implemented in hardware, software, or firmware (ASIC).

The first reference RF may include first reference information and second reference information. The first reference information may be a bending path RP of an ideal circuit board. For example, an initial value of the first reference information may be a curve having a radius of curvature of about 3R. The initial value may be a preset experimental value of the design of experiment (DOE).

The control unit CT may compare the bending path RP with the first reference information.

The control unit CT may compensate the first reference RF based on the bending path RP when the first information IN1 (e.g., the movement path) is not matched with the first reference information of the first reference RF in the process S700. Here, the bending path RP of the circuit board PF is calculated based on the movement path of the bending arm BA. For example, the control unit CT may calculate that the bending path RP of the circuit board PF is a curve having a radius of curvature of about 2.5R from the first information IN1. The control unit CT may determine that the calculated bending path RP is not matched with the curve having the radius of curvature of about 3R that is the initial value of the first reference information in the process S400. The control unit CT may compensate the first reference RF and change a force for bending the circuit board PF by the bending arm BA in the process S700. The display module bending apparatus 1000 may bend the circuit board PF so that the bending path RP (refer to FIG. 6) of the circuit board PF has the curve having the radius of curvature of about 3R. That is, the display module DM to be bent in a following process may have a more optimized bending value than the display module DM bent in a previous process.

Unlike an embodiment of the present invention, in general, when a flexible member is bent, a compressive force and a tensile force, which are generated when a position of the member is distorted after bent, may be applied. In this case, the member may be damaged, and a quality of the product may be degraded. However, according to an embodiment of the present invention, the control unit CT may compensate the first reference RF. Therefore, as the bending processes of the display module DM are performed, the optimized bending value may be provided to the display module DM to be bent in a following process. A stress applied to the display module DM when bent may be minimized. A damage applied to the display module DM may be effectively minimized. A quality of the display module DM may improve. Thus, the display module bending apparatus 1000 having a reduced stress applied to the bending area BD may be provided according to an embodiment.

Figure 7:
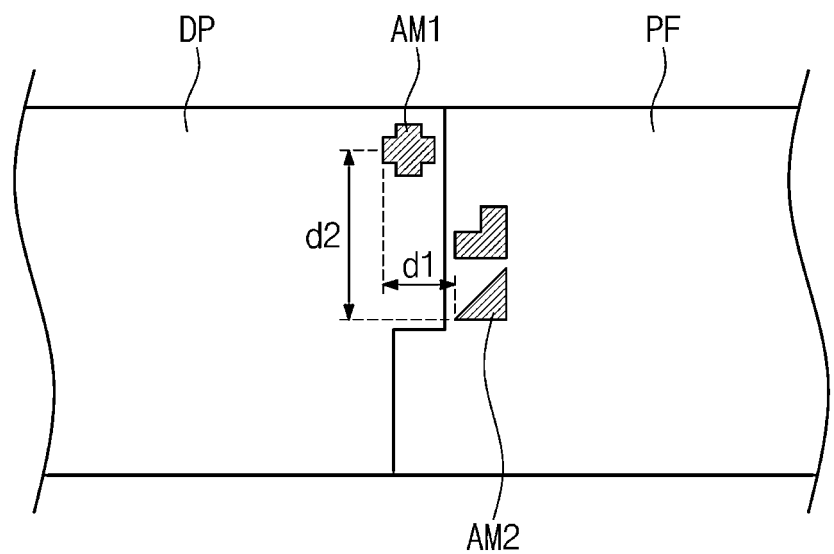
FIG. 7 is a view illustrating a process of measuring second information by a second measuring unit and a process of determining whether the second information satisfies the first reference according to an embodiment of the present invention.

FIG. 7 illustrates a process of measuring the second information by the second measuring unit and a process of determining whether the second information satisfies the first reference according to an embodiment of the present invention.

Referring to FIGS. 4 to 7, the second measuring unit TC may be disposed on the stage ST and the display module DM. When the bending is completed, the bending area BD may be defined in the circuit board PF. The second information IN2 may include an image obtained by photographing the display panel DP and the circuit board PF, on which the bending process is completed, by the second measuring unit TC with a view in the third direction DR3.

The display panel DP may include the first mark AM1. The circuit board PF may include the second mark AM2. Although one first mark AM1 and two second marks AM2 are illustrated as an example in FIG. 7, the embodiment of the present invention is not limited to the number of each of the first mark AM1 and the second mark AM2 shown in FIG. 7. For example, the display panel DP may include one first mark AM1, and the circuit board PF may include one second mark AM2 in another embodiment.

The control unit CT may determine whether the display panel DP is aligned with the circuit board PF by determining whether the first mark AM1 is aligned with the second mark AM2.

The second information IN2 may include the distances d1 and d2 between the first mark AM1 and the second mark AM2. The distances d1 and d2 may include a first distance d1 measured in the second direction DR2 and a second distance d2 measured in the first direction DR1.

The first reference RF may include first reference information and second reference information. The second reference information may be the ideal first distance d1 and the ideal second distance d2.

The control unit CT may compare each of the measured first distance d1 and the measured second distance d2 with the second reference information.

The control unit CT may compensate the first reference RF based on the measured distances d1 and d2 when the second information IN2 is not matched with the second reference information in the process S700. For example, the control unit CT may calculate that the bending path RP of the circuit board PF is a curve having a radius of curvature of about 3R from the first information IN1. The control unit CT may determine that the calculated bending path RP is matched with the curve having the radius of curvature of about 3R that is the initial value of the first reference information in the process S400. The control unit CT may determine that at least one of the first distance d1 and the second distance d2 is not matched with the second reference information from the second information IN2 in a process S600. The control unit CT may compensate the bending path RP to match the first distance d1 and the second distance d2 in the process S700. The control unit CT may compensate the first reference information as a curve having a radius of curvature of about 2.7R. The compensated first reference information may be referred to as third reference information. The third reference information may be different from the first reference information. A reference including the third reference information may be referred to as a second reference. The display module bending apparatus 1000 may bend the circuit board PF so that the bending path RP of the circuit board PF has the curve having the radius of curvature of about 2.7R. When the display module DM is bent in a following process, the first information IN1 may be matched with the second reference in the process S400, and the second information IN2 may be matched with the second reference in the process S600. That is, the display module DM to be bent in a following process may have a more optimized bending value than the display module DM bent in a previous process.

Also, unlike an embodiment of the present invention, other processes may be performed before the bending process is performed. Here, tolerances generated in the other processes may be accumulated. For example, a tolerance may be generated in a process of forming the first mark AM1 and the second mark AM2. Also, a tolerance may be generated in a process of manufacturing each of the display panel DP and the circuit board PF. In addition, a tolerance may be generated by equipment for each of components of the display module bending apparatus. Thus, each of the display modules DM may have a different optimized bending path. However, according to an embodiment of the present invention, the control unit CT may continuously compensate the first reference RF although the tolerances are accumulated. As the bending processes of the display module DM are performed, the optimized bending value may be provided to the display module DM to be bent in a following process. Therefore, the stress applied to the display module DM when bent may be minimized. The damage applied to the display module DM may be effectively minimized. The quality of the display module DM may improve. Thus, the display module bending apparatus 1000 having a reduced stress applied to the bending area BD may be provided.

Figure 8:
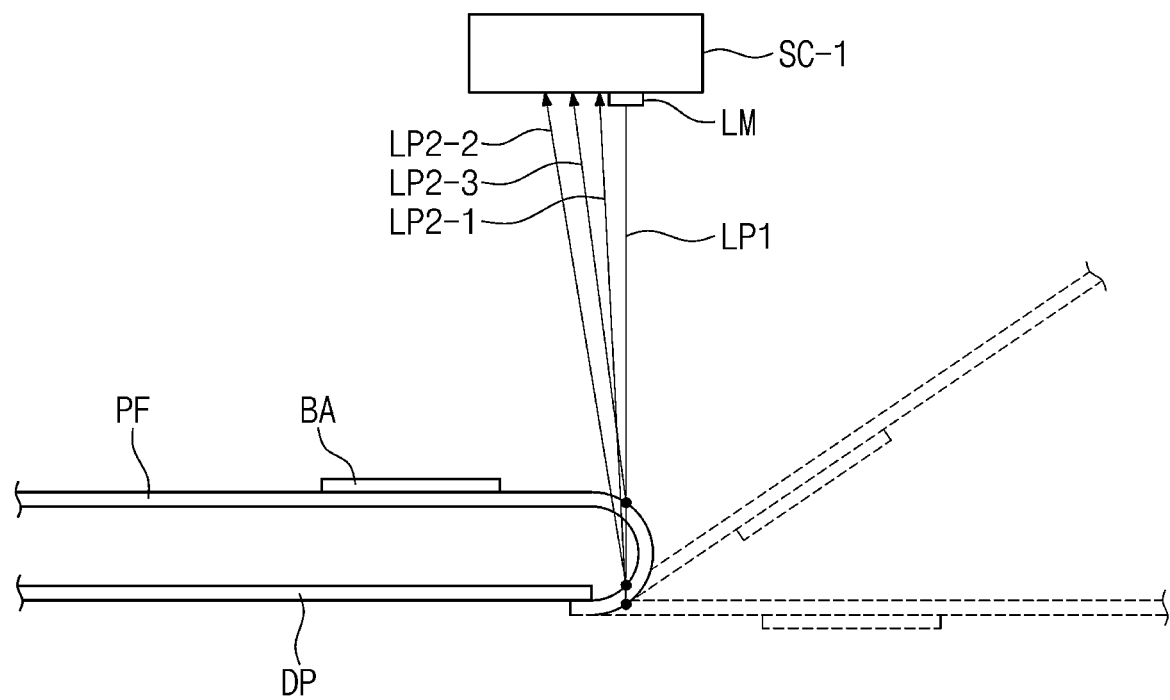
FIG. 8 is a view illustrating a process of measuring first information by a first measuring unit and a process of determining whether the first information satisfies a first reference according to another embodiment of the present invention.

FIG. 8 illustrates a process of measuring the first information by the first measuring unit and a process of determining whether the first information satisfies the first reference according to another embodiment of the present invention. When FIG. 8 is described, the components described in FIG. 6 will be designated by the same reference symbols, and a description thereof will be omitted.

Referring to FIGS. 4, 5, and 8, a first measuring unit SC-1 may be disposed on the display module DM and the stage ST. The first measuring unit SC-1 may include a laser module LM that irradiates a laser LP1. However, this is merely an example, and the embodiment of the present invention is not limited to the first measuring unit SC-1 as long as the first measuring unit SC-1 is capable of measuring the bending path. For example, the first measuring unit SC-1 may include a 3D scan sensor or a 2D line scan sensor.

The first measuring unit SC-1 may irradiate the laser LP1 toward the circuit board PF. The first measuring unit SC-1 may receive reflected lasers LP2-1, LP2-2, and LP2-3 generated as the laser LP1 is reflected by the circuit board PF.

The reflected lasers LP2-1, LP2-2, and LP2-3 may include a first reflected laser LP2-1, a second reflected laser LP2-2, and a third reflected laser LP2-3. The first reflected laser LP2-1 may be the laser LP1 reflected from the circuit board PF before the circuit board PF is bent. The second reflected laser LP2-2 may be the laser LP1 reflected from the circuit board PF while the circuit board PF is being bent. The third reflected laser LP2-3 may be the laser LP1 reflected from the circuit board PF after the circuit board PF is bent.

The control unit CT may receive the first information IN1 from the first measuring unit SC-1. The first information IN1 may include a reflected path generated based on the reflected lasers LP2-1, LP2-2, and LP2-3. The reflected path may be a line obtained by continuously connecting values measured from the first reflected laser LP2-1, the second reflected laser LP2-2, and the third reflected laser LP2-3, respectively. The control unit CT may calculate the bending path of the circuit board PF based on the reflected path.

The control unit CT may determine whether the first information IN1 satisfies the first reference RF in the process S400.

Figure 9:
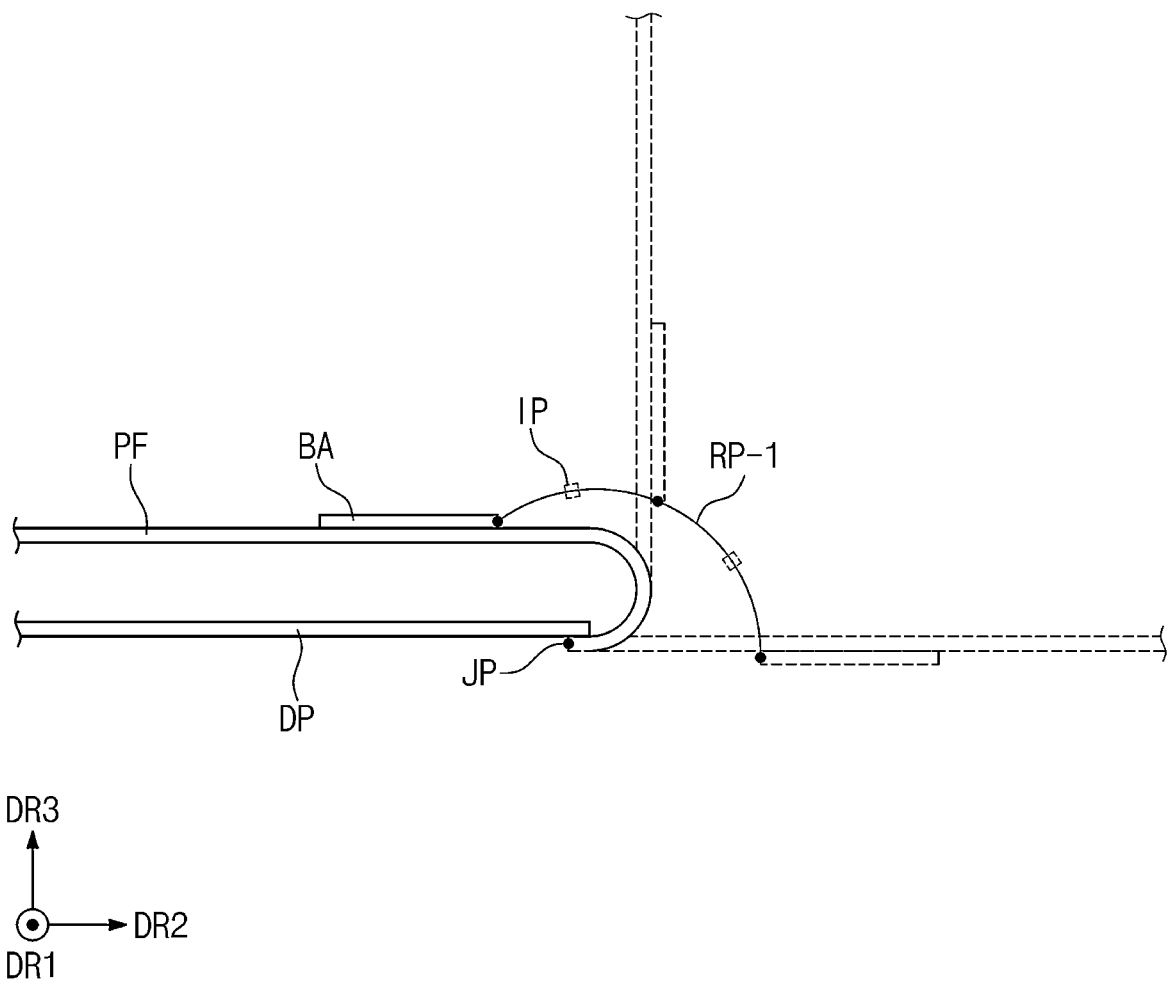
FIG. 9 is a view illustrating a process of measuring the first information by the first measuring unit and a process of determining whether the first information satisfies the first reference according to an embodiment of the present invention.

FIG. 9 illustrates a process of measuring the first information by the first measuring unit and a process of determining whether the first information satisfies the first reference according to an embodiment of the present invention. When FIG. 9 is described, the components described in FIG. 6 will be designated by the same reference symbols, and a description thereof will be omitted.

Referring to FIGS. 4, 5, and 9, the first measuring unit SC may be disposed at the side surface of the display module DM. The first information IN1 may include a plurality of measurement points CP obtained by measuring positions of the bending arm BA with a predetermined time interval. For example, the first measuring unit SC may include a camera having an operating speed of a low fps. The camera may have an operating speed less than about 100 fps. When the camera having the low fps is used as the first measuring unit SC, the number of the plurality of measurement points CP may decrease.

The simulation part SIM may calculate a plurality of virtual points IP by using an algorithm such as machine learning or deep learning.

The simulation part SIM may calculate a movement path of the bending arm BA based on the plurality of measurement points CP, the plurality of virtual points IP, and a reference point JP. The control unit CT may calculate the bending path RP-1 based on the movement path.

According to an embodiment of the present invention, the simulation part SIM may easily calculate the bending path RP-1 by using the algorithm although a performance of the camera of the first measuring unit SC is degraded. Thus, the display module bending apparatus having improved reliability and the display module bending method using the same may be provided.

As described above, as the first reference is compensated in the display module bending process, the second reference may be calculated. In the following display module bending process, the bending arm may bend the circuit board based on the second reference compensated in the previous bending process. As the bending processes of the display module is performed, the optimized bending value may be provided to the display module to be bent in the following process. Thus, the stress applied to the display module when bent may be minimized. The damage applied to the display module may be minimized. The quality of the display module may improve. The process efficiency may improve by reducing the damage caused by the bending. Thus, the display module bending apparatus capable of minimizing the damage applied to the display module during the bending process and the display module bending method may be provided.

Although the embodiments of the present invention have been described, it is understood that the present invention should not be limited to these embodiments but various changes and modifications can be made by one ordinary skilled in the art within the spirit and scope of the present invention as hereinafter claimed. Hence, the real protective scope of the present invention shall be determined by the technical scope of the accompanying claims.

What is claimed is:

1. A display module bending apparatus comprising:
a stage on which a display module comprising a display panel and a circuit board is seated;
a bending arm which fixes the circuit board and bends the circuit board based on a first reference;
a first measuring circuitry which measures first information;
a second measuring circuitry disposed on the stage and which measures second information; and
a control circuitry which compensates the first reference based on the first information and the second information.

2. The display module bending apparatus of claim 1, wherein the control circuitry calculates a bending path of the circuit board based on the first information.

3. The display module bending apparatus of claim 2, wherein the bending path is calculated based on a movement path of the bending arm.

4. The display module bending apparatus of claim 3, wherein the control circuitry comprises a simulation part, the first information comprises a plurality of measurement points, and the simulation part calculates the movement path based on the plurality of measurement points.

5. The display module bending apparatus of claim 2, wherein the control circuitry comprises a compensation part which calculates a second reference by compensating the first reference.

6. The display module bending apparatus of claim 5, wherein the bending arm bends the circuit board based on the second reference.

7. The display module bending apparatus of claim 2, wherein the first reference comprises first reference information and second reference information, and the control circuitry compares the bending path with the first reference information, wherein the control circuitry compensates the first reference based on the bending path when the first information is not matched with the first reference information.

8. The display module bending apparatus of claim 7, wherein the second reference comprises third reference information different from the first reference information, and the control circuitry compares the bending path with the third reference information.

9. The display module bending apparatus of claim 1, wherein the first measuring circuitry is disposed to face a side surface of the display panel.

10. The display module bending apparatus of claim 9, wherein the first measuring circuitry comprises an image photographing part which photographs an image.

11. The display module bending apparatus of claim 1, wherein the first measuring circuitry comprises a laser module disposed on the stage and which irradiates a laser.

12. The display module bending apparatus of claim 1, wherein the display panel comprises a first mark, the circuit board comprises a second mark, and the second information comprises a distance between the first mark and the second mark.

13. The display module bending apparatus of claim 12, wherein the control circuitry compares the distance with the second reference information, wherein the control circuitry compensates the first reference based on the distance when the distance is not matched with the second reference information.

* * * * *